(12) United States Patent
Kusama et al.

(10) Patent No.: US 11,222,803 B2
(45) Date of Patent: Jan. 11, 2022

(54) STOCKER

(71) Applicant: MURATA MACHINERY, LTD., Kyoto (JP)

(72) Inventors: Yu Kusama, Inuyama (JP); Toru Suzuki, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 91 days.

(21) Appl. No.: 16/483,460

(22) PCT Filed: Jan. 11, 2018

(86) PCT No.: PCT/JP2018/000435
§ 371 (c)(1),
(2) Date: Aug. 5, 2019

(87) PCT Pub. No.: WO2018/146986
PCT Pub. Date: Aug. 16, 2018

(65) Prior Publication Data
US 2020/0035534 A1   Jan. 30, 2020

(30) Foreign Application Priority Data

Feb. 7, 2017 (JP) .............................. JP2017-020225

(51) Int. Cl.
*H01L 21/677* (2006.01)
*B65G 1/02* (2006.01)
*H01L 21/673* (2006.01)

(52) U.S. Cl.
CPC .......... *H01L 21/67769* (2013.01); *B65G 1/02* (2013.01); *H01L 21/67379* (2013.01); *H01L 21/67383* (2013.01); *H01L 21/67389* (2013.01)

(58) Field of Classification Search
CPC ........ H01L 21/67769; H01L 21/67379; B65G 1/02
See application file for complete search history.

(56) References Cited

U.S. PATENT DOCUMENTS

| 7,902,492 B2 * | 3/2011 | Matsuba ................... G01P 5/02 250/216 |
| 2015/0000785 A1 * | 1/2015 | Shin .................. H01L 21/67769 141/4 |

FOREIGN PATENT DOCUMENTS

| CN | 203491553 U | 3/2014 |
| JP | 2016-021429 A | 2/2016 |

OTHER PUBLICATIONS

Official Communication issued in International Patent Application No. PCT/JP2018/000435, dated Mar. 6, 2018.

* cited by examiner

*Primary Examiner* — Saul Rodriguez
*Assistant Examiner* — Willie Berry, Jr.
(74) *Attorney, Agent, or Firm* — Keating & Bennett, LLP (57) ABSTRACT

A stocker includes a wall that separates an inside and an outside of the stocker, a storage area on an inner side of the wall and in which articles are stored, a fan on the wall to draw in outside air and introduce the outside air into the inside of the stocker, a control panel storage provided on the inner side of the wall and laterally to the storage area to store a control panel, a first thermal insulation layer on a wall side of the control panel storage, and a second thermal insulation layer on a storage area side of the control panel storage.

6 Claims, 7 Drawing Sheets

FIG. 7

STOCKER

BACKGROUND OF THE INVENTION

1. Field of the Invention

The present invention relates to a stocker.

2. Description of the Related Art

A stocker is installed in a semiconductor manufacturing factory or the like in order to store a plurality of containers (articles) for accommodating reticles, semiconductor wafers or the like. The stocker has a wall that separates an inside and an outside of the stocker; a storage area which is arranged on an inner side of the wall and in which articles are stored; and a control panel storage which is arranged on an outer side of the wall and which stores a control panel which controls the operation of each part. In such a stocker, there is a possibility that heat generated in the control panel may influence the container stored in the storage area or the contents of container. For this reason, there is known a configuration in which a thermal insulation layer is arranged on the storage area side of the control panel storage so that the heat of the control panel storage is not transferred to the storage area (for example, see Japanese Unexamined Patent Application, First Publication No. 2016-21429).

In the stocker disclosed in Japanese Unexamined Patent Application, First Publication No. 2016-21429, a thermal insulation layer is arranged on the storage area side of the control panel storage, and the thermal insulation layer blocks or suppresses heat transfer through the boundary portion between the control panel storage and the storage area. However, the heat of the control panel may still be transferred to the storage area from parts other than the boundary portion between the control panel storage and the storage area, and when heat is transferred to the storage area, it may influence the container placed in the storage area or the contents of the container. For this reason, in the stocker above, it is required to effectively block or suppress transfer of generated heat from the control panel to the storage area, and to reduce the influence of heat of the control panel on the storage area.

SUMMARY OF THE INVENTION

Preferred embodiments of the present invention provide stockers each capable of reducing influences of heat on articles (containers or contents of the containers) in a storage area by effectively blocking or suppressing heat transfer from a control panel to the storage area.

A stocker according to a preferred embodiment of the present invention includes a wall that separates an inside and an outside of the stocker, a storage area on an inner side of the wall and in which articles are stored, a fan on the wall to draw in outside air and introduce the outside air into the inside of the stocker, a control panel storage on the inner side of the wall and laterally to the storage area to store a control panel, a first thermal insulation layer on a wall side of the control panel storage, and a second thermal insulation layer on a storage area side of the control panel storage.

The first thermal insulation layer may be a ventilation layer which allows air to flow therethrough. The ventilation layer may be a duct which extends in a vertical direction, and the duct may include a first vent in one of an upper portion and a lower portion of the stocker to communicate the outside of the wall with the inside of the duct, a second vent in the other of the upper portion and the lower portion of the stocker to communicate the inside of the duct with the inside of the control panel storage, and a second fan arranged laterally on an opposite side of the storage area of the control panel storage to draw in the air in the control panel storage and blow the air out to the outside the stocker. The second fan may be located above the fan. The control panel storage may be provided in vertically multiple layers, and the second fan may be provided for each of these layers. The second thermal insulation layer may be a ventilation layer to allow air to flow therethrough.

According to preferred embodiments of the present invention, since the first thermal insulation layer on the wall side of the control panel storage and the second thermal insulation layer on the storage area side of the control panel storage are provided, it is possible to reduce or prevent temperature increases on the wall side and the storage area side of the control panel storage, respectively. In the configuration in which the fan on the wall draws in outside air and introduces the outside air into the storage area, the air, the temperature of which has risen as a result of the heat having been transferred from the wall side of the control panel storage to the outside, may be drawn in by another fan that is also provided on the same wall side. However, by providing the first thermal insulation layer, it is possible to block or suppress transfer of heat from the control panel storage to the wall side, and to reduce or prevent the temperature rise in the air which has been introduced into the storage area by the fan. This configuration enables reduction in the influence of heat on articles in a storage area by blocking or suppressing heat transfer from the control panel to the storage area.

In those cases where the first thermal insulation layer is a ventilation layer which allows air to flow therethrough, influence of the heat generated in the control panel is able to be reliably reduced by effectively blocking or suppressing heat transfer in the first thermal insulation layer. In those cases where the ventilation layer is a duct extending in a vertical direction, and the duct includes a first vent in one of an upper portion and a lower portion of the stocker to communicate the outside of the wall with the inside of the duct, a second vent in the other of the upper portion and the lower portion of the stocker to communicate the inside of the duct with the inside of the control panel storage, and a second fan arranged laterally on the opposite side of the storage area of the control panel storage, and which draws in the air in the control panel storage and blows the air out to the outside of the stocker, the second fan creates an air flow in the duct and releases the heat inside the control panel storage to the outside, so that the influence of generated heat from the control panel is able to be reliably reduced.

In cases where the second fan is above the fan, it is possible to prevent the air released from the second fan to the outside of the stocker from being introduced into the storage area in the stocker again by the fan. In cases where the control panel storage is provided in vertically multiple layers and the second fan is provided for each of these layers, the inside air is able to be individually released to the outside from the control panel storage provided in each layer, and heat transfer from each control panel storage to the storage area is able to be effectively blocked or suppressed. In cases where the second thermal insulation layer is a ventilation layer to allow air to flow therethrough or is a thermal insulation material, since the ventilation layer is provided at the boundary between the control panel storage and the storage area, transfer of the heat to the storage area is able to be appropriately blocked or suppressed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The following describes preferred embodiments of the present invention with reference to the drawings. However, the present invention is not limited to the preferred embodiments described herein. In the drawings, scale is changed as necessary to illustrate the preferred embodiments, such as by enlarging or by emphasizing an element or portion. Also, in each figure, a horizontal direction (the direction parallel to floor FL), which is a longitudinal direction of storage area 12 described later (or a traveling direction of a transporter 40 described later), is referred to as a first direction D1, a horizontal direction, which is a direction orthogonal to the first direction D1, is referred to as a second direction D2, and a vertical direction perpendicular to floor FL is referred to as a third direction D3.

Figure 1:
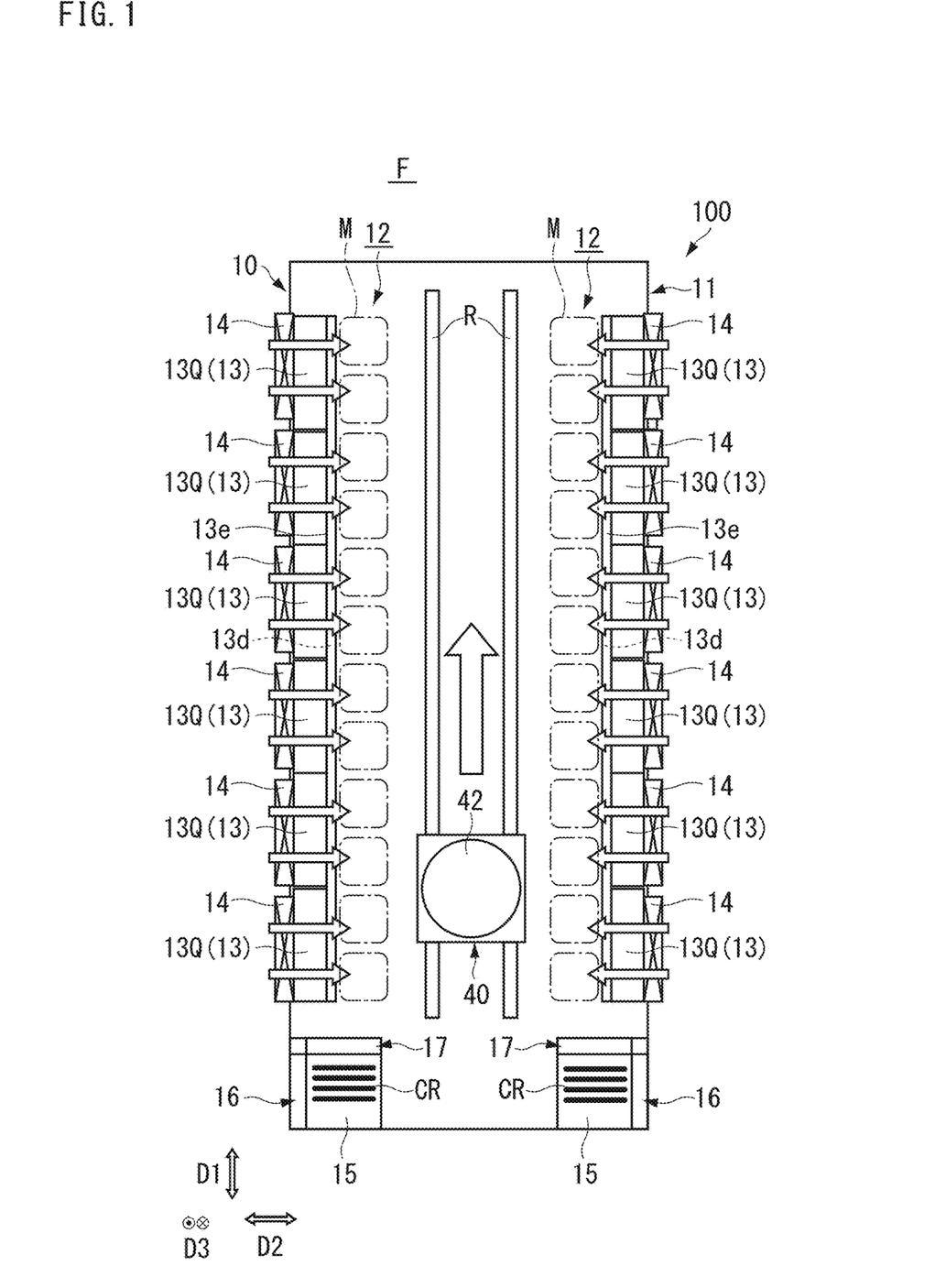
FIG. 1 is a cross-sectional view showing an example of a stocker according to a preferred embodiment of the present invention.
Figure 2:
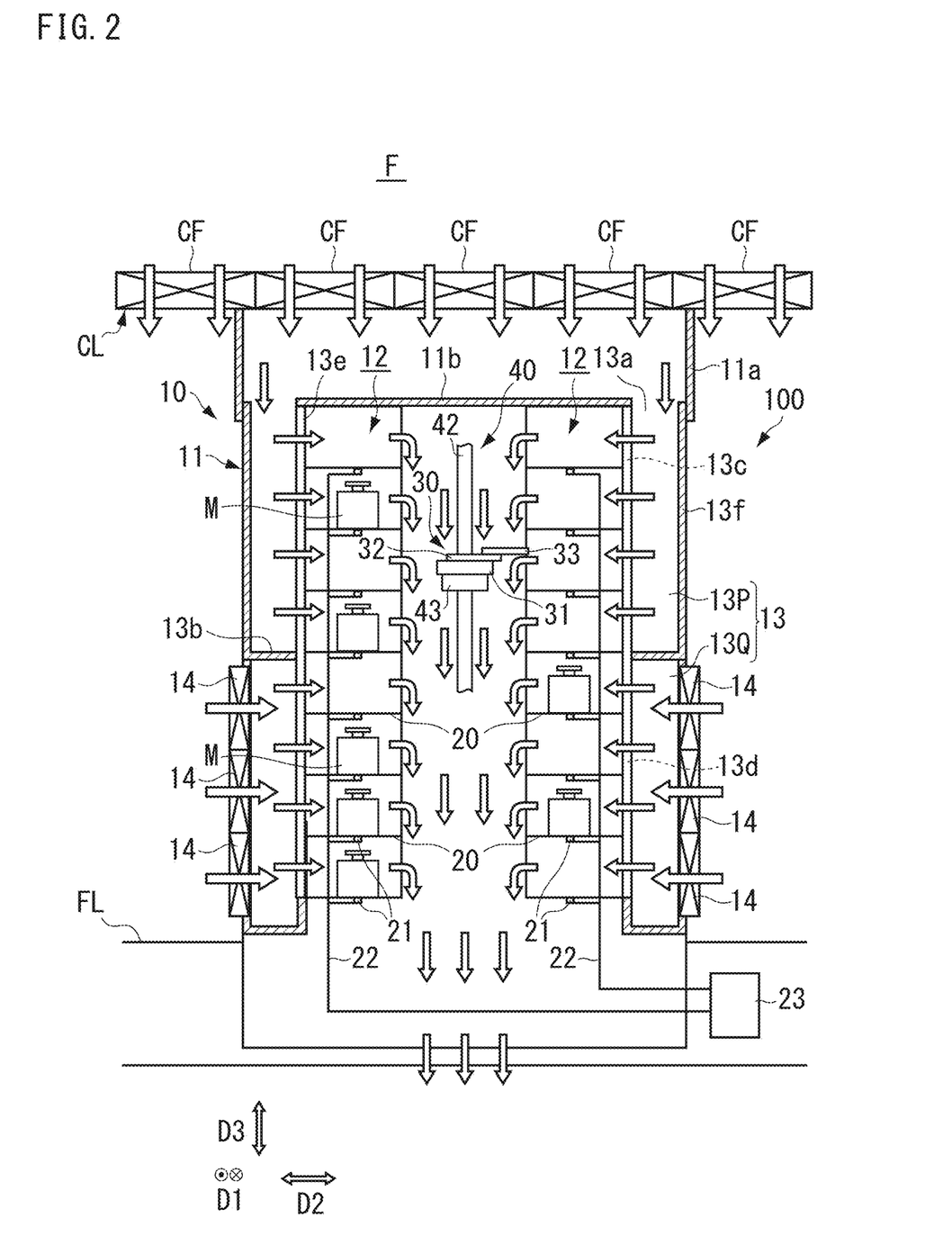
FIG. 2 is a cross-sectional view of a stocker according to a preferred embodiment as viewed from a side.

FIG. 1 and FIG. 2 are diagrams showing an example of a stocker 100 according to a preferred embodiment of the present invention. FIG. 1 is a cross-sectional view of the stocker 100 as viewed from above, and FIG. 2 is a cross-sectional view of the stocker 100 as viewed from a side (in the first direction D1). As shown in FIG. 1 and FIG. 2, the stocker 100 includes a main body 10, racks 20, a transferer 30, and a transporter 40. The stocker 100 stores articles M inside thereof. In the present preferred embodiment, the article M is, for example, a reticle pod that accommodates reticles. The article M accommodates one or several reticles. When accommodating a plurality of reticles, the article M accommodates the reticles which are in a state of being aligned in the vertical direction.

The main body 10 is installed on the floor FL of a building F such as a semiconductor manufacturing factory, and the temperature or the humidity inside thereof are managed. The main body 10 includes a wall 11, storage areas 12, ducts 13, fans 14, control panel storages 15, first thermal insulation layers 16, and second thermal insulation layers 17. The wall 11 preferably surrounds a space including the storage areas 12 and separates inside and outside of the stocker 100. The wall 11 is formed, for example, in a rectangular or substantially rectangular shape when viewed from above. Each storage area 12 is a space in which the articles M are stored, and is provided on the inner side of the wall 11. The storage area 12 is provided on both sides of an area where the transporter 40 (the transferer 30) travels.

The ducts 13 are respectively arranged on the wall 11 side of the two storage areas 12. Each duct 13 has a rectangular or substantially rectangular box shape for example, and extends in the vertical direction. The duct 13 is vertically provided to extend from the bottom portion to the top portion of the storage area 12. A plurality of the ducts 13 are arranged side by side along the horizontal direction (the first direction D1) of the wall 11. In FIG. 1, each duct 13 is provided so as to correspond to two articles M placed on the rack 20. However, preferred embodiments of the present invention are not limited to this configuration, and the duct 13 may be provided so as to correspond to one article M or the duct may be provided so as to correspond to three or more articles M. The plurality of ducts 13 arranged in the horizontal direction may have the same size or different sizes.

The duct 13 is provided preferably by arranging an inner duct wall 13e and an outer duct wall 13f at a predetermined interval, and has an inlet 13a, a flow regulator 13b, and blowout openings 13c, 13d. The outer duct wall 13f defines the wall 11 of the stocker 100. The inlet 13a is arranged at an upper end of the duct 13. The inlet 13a introduces the air flowing downward, into the duct 13.

For example, the inlet 13a introduces the air that is caused to flow downward by ceiling fans CF provided on a ceiling CL of the building F. A plurality of the ceiling fans CF are arranged on the ceiling CL of the building F, and generate a downflow in the building F. A fan filter is used for the ceiling fans CF, for example. The inlet 13a opens upward to take a portion of the downflow (air flowing downward) created by the ceiling fans CF, into the duct 13.

The flow regulator 13b is provided in the duct 13. The flow regulator 13b is, for example, a partitioning plate that separates the upper side and the lower side of the duct 13. The flow regulator 13b regulates the flow of air between the upper side and the lower side of the duct 13. By providing the flow regulator 13b, the air introduced from the inlet 13a is regulated from flowing to the lower side of the duct 13. The flow regulator 13b is not limited to the configuration that separates the upper side and the lower side of the duct 13 without having a clearance therebetween. For example, as the flow regulator 13b, a filter of a low ventilation rate may be used and may be arranged so as to have a clearance to the wall of the duct 13.

Further, the height at which the flow regulator 13b is provided can be set arbitrarily. The flow regulator 13b may be provided, for example, at or near an intermediate position in the vertical direction of the duct 13. When the downflow created by the ceiling fans CF is strong for example, air is sufficiently sent to the lower side of the duct 13, and, therefore, the height of the flow regulator 13b may be set below the intermediate position in the vertical direction of the duct 13. When the downflow created by the ceiling fans CF is weak, air is not sufficiently sent to the lower side of the duct 13, and, therefore, the height of the flow regulator 13b may be set above the intermediate position in the vertical direction of the duct 13. Also, the height of the flow regulator 13b may be changeable in the vertical direction. Whether or not to provide the flow regulator 13b is arbitrary, and the flow regulator 13b need not be provided.

The blowout openings 13c, 13d are provided in the duct wall 13e on the storage area 12 side of the duct 13. The blowout openings 13c, 13d are provided at a plurality of locations so as to blow out the air having been introduced into the duct 13, into the storage area 12. The blowout opening 13c is provided in the duct wall 13e of an upper portion 13P of the flow regulator 13b of the duct 13. The blowout opening 13d is provided in the duct wall 13e of a lower portion 13Q of the flow regulator 13b of the duct 13. For the duct wall 13e, a perforated metal is used, for example. Although not shown in the drawings, the plurality of blowout openings 13c, 13d may be arranged side by side at equal or substantially equal pitches in the vertical direction and the horizontal direction, for example, in the lower portion 13Q and the upper portion 13P, and may even be arranged at unequal pitches so long as the desired function thereof is satisfied. The opening ratio of the lower portion 13Q and the upper portion 13P may respectively be constant in the vertical direction or may respectively be changed in the vertical direction.

The fans 14 are arranged in the lower portion 13Q of the duct 13. The fans 14 may be arranged in the upper portion 13P of the duct 13. The fans 14 are arranged on the duct wall 13f of the duct 13 opposing the storage area 12. The duct wall 13f is faces the outside of the stocker 100. Each fan 14 includes an air intake facing the wall 11 of the stocker 100, draws in air outside the wall 11 (main body 10), and introduces the air into the lower portion 13Q of the duct 13. Air outside the main body 10 is the air in the building F, which is a portion of the downflow created by the ceiling fans CF. The fans 14 are, for example, fan filters.

The fans 14 blow out the drawn outside air horizontally toward the storage area 12 through the lower portion 13Q of the duct 13. That is to say, the air having been drawn into the lower portion 13Q of the duct 13 by the fans 14 is blown out from the plurality of blowout openings 13d toward the storage area 12 in the second direction D2.

The fans 14 are provided in the lower portion 13Q of the duct 13 in the horizontal direction with no clearance therebetween as shown in FIG. 1, however, there may be a clearance therebetween. The fans 14 are provided in the lower portion 13Q of the duct 13 in the vertical direction with no clearance therebetween as shown in FIG. 2, however, there may be a clearance therebetween. The same type of fan 14 is used for the plurality of fans 14 arranged, however, preferred embodiments of the present invention are not limited to this configuration. For example, different types of fans 14 may be provided in the vertical direction and in the horizontal direction. The plurality of fans 14 are not limited to being all driven simultaneously, and may be driven alternately or sequentially. Some or all of the plurality of fans 14 are not limited to being continuously driven, and may be intermittently driven.

Figure 3:
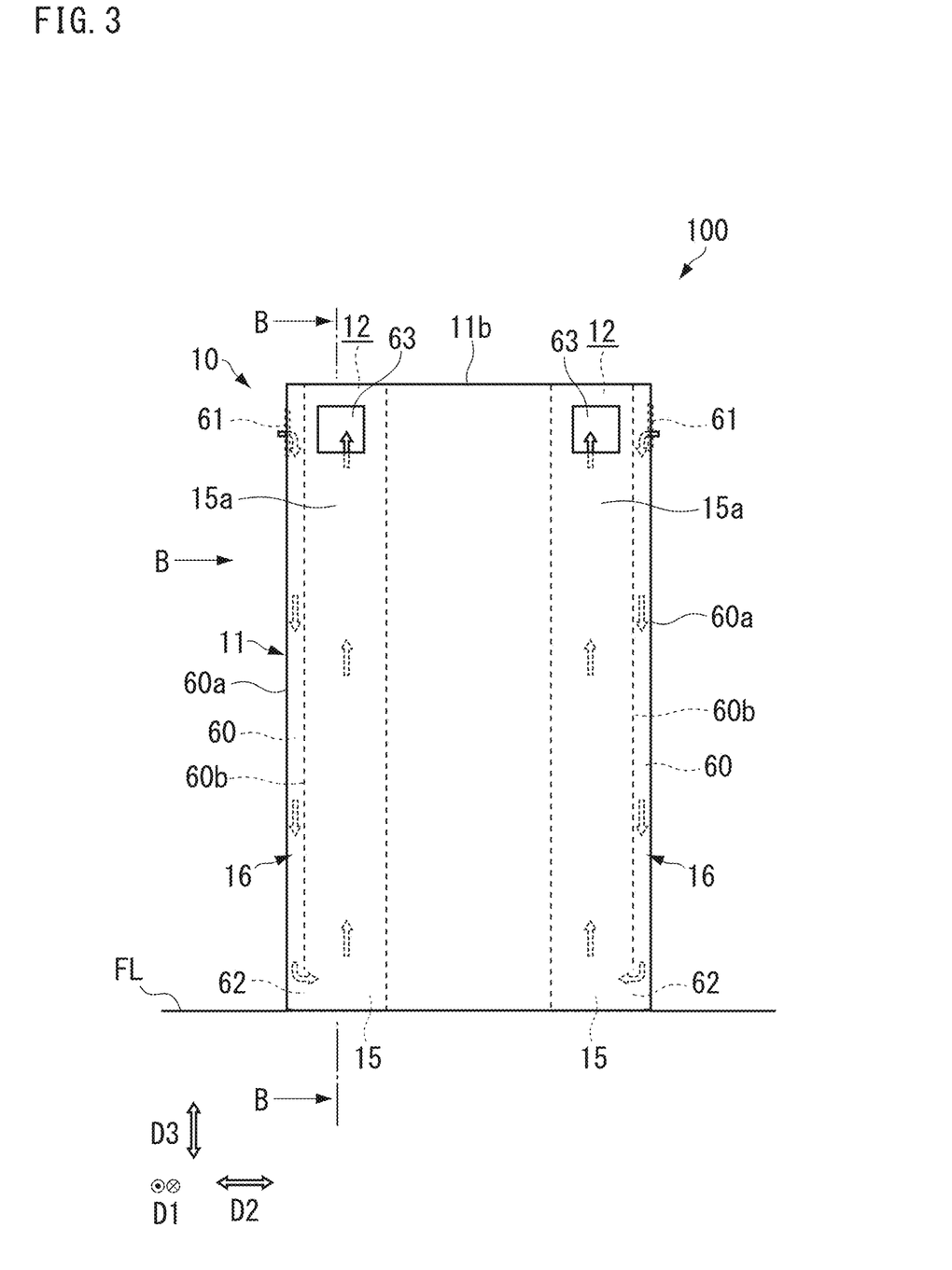
FIG. 3 is a side view of a stocker according to a preferred embodiment of the present invention.
Figure 4:
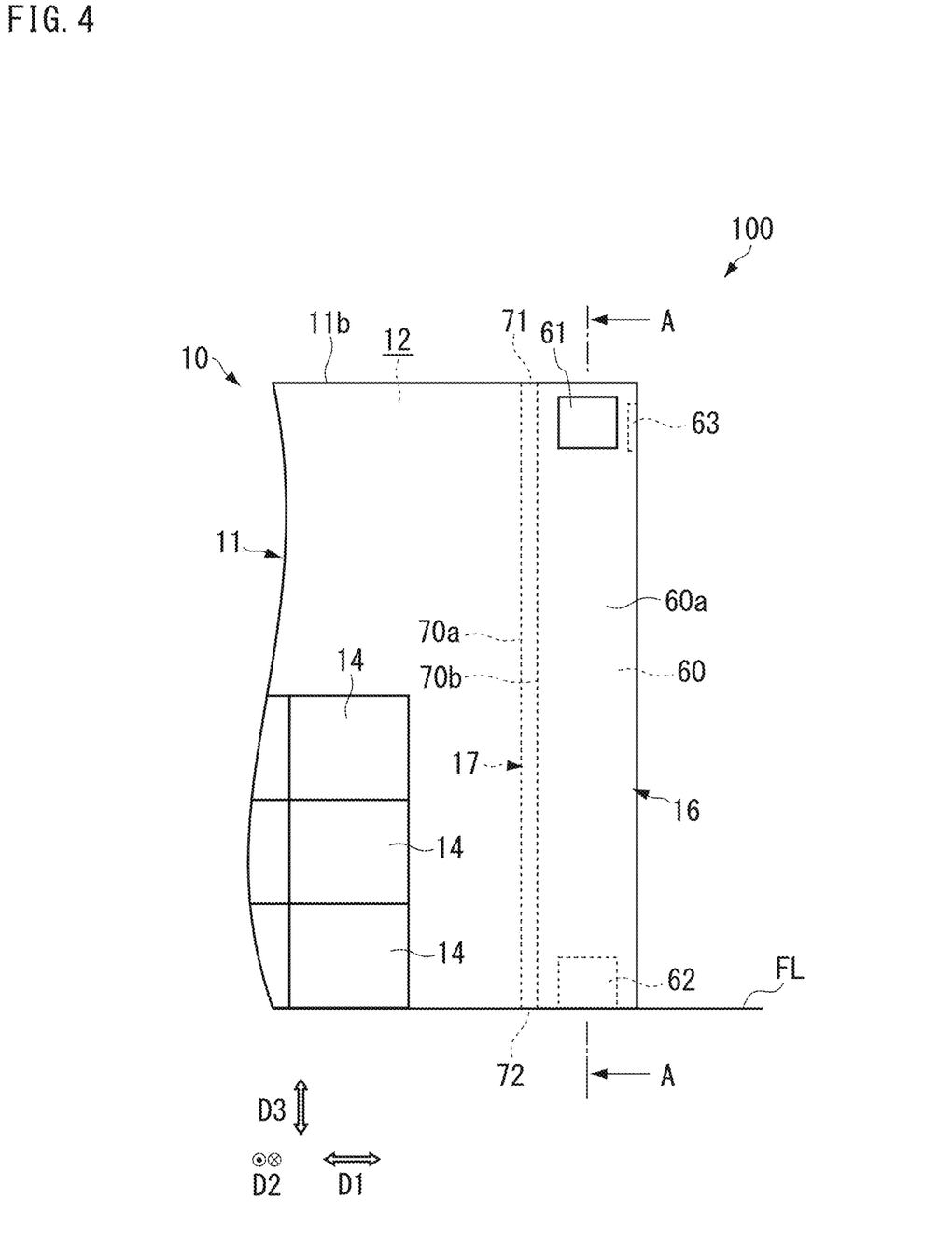
FIG. 4 is a front elevation view of a stocker according to a preferred embodiment of the present invention.
Figure 5:
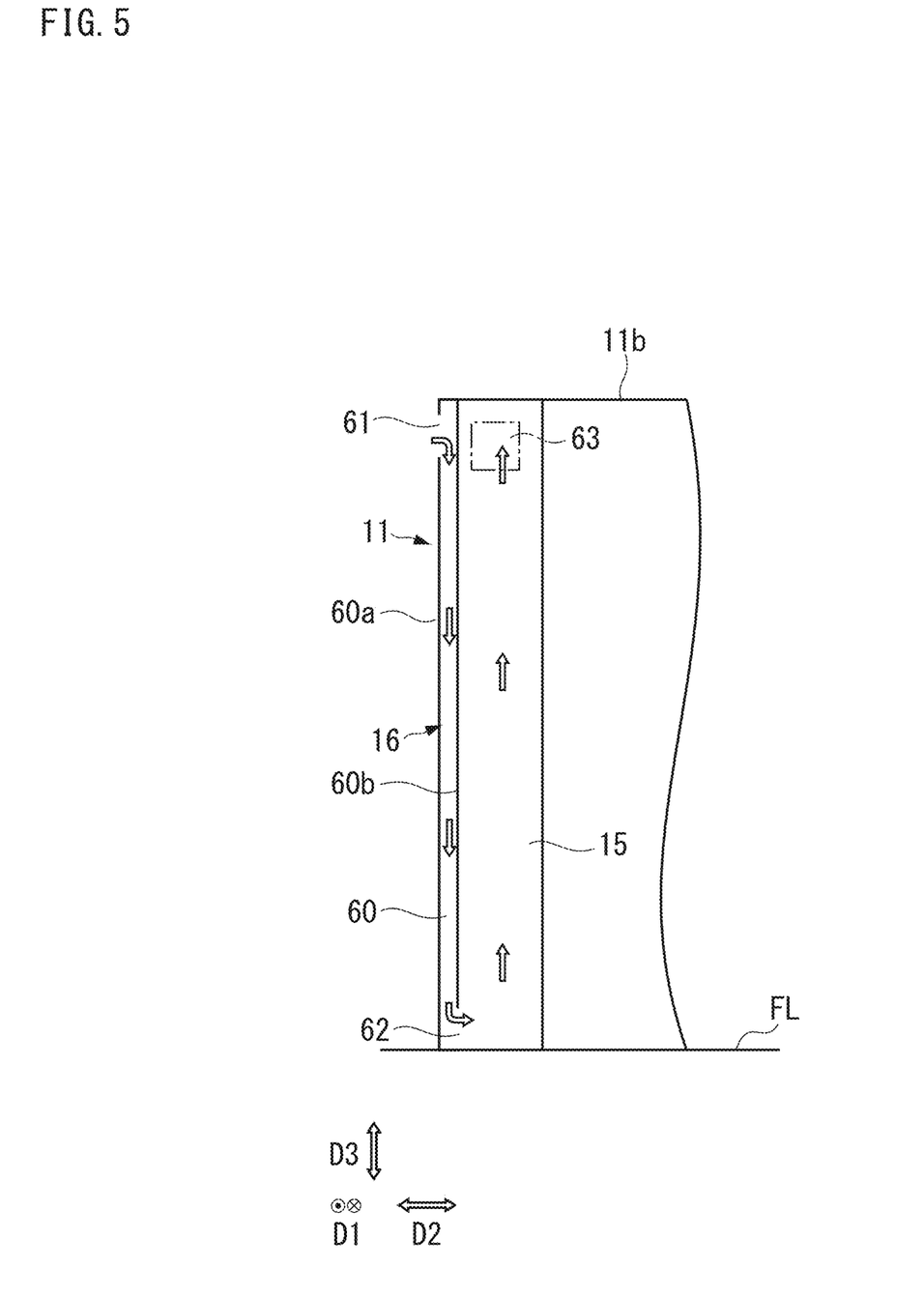
FIG. 5 is a cross-sectional view taken along the line A-A of FIG. 4.
Figure 6:
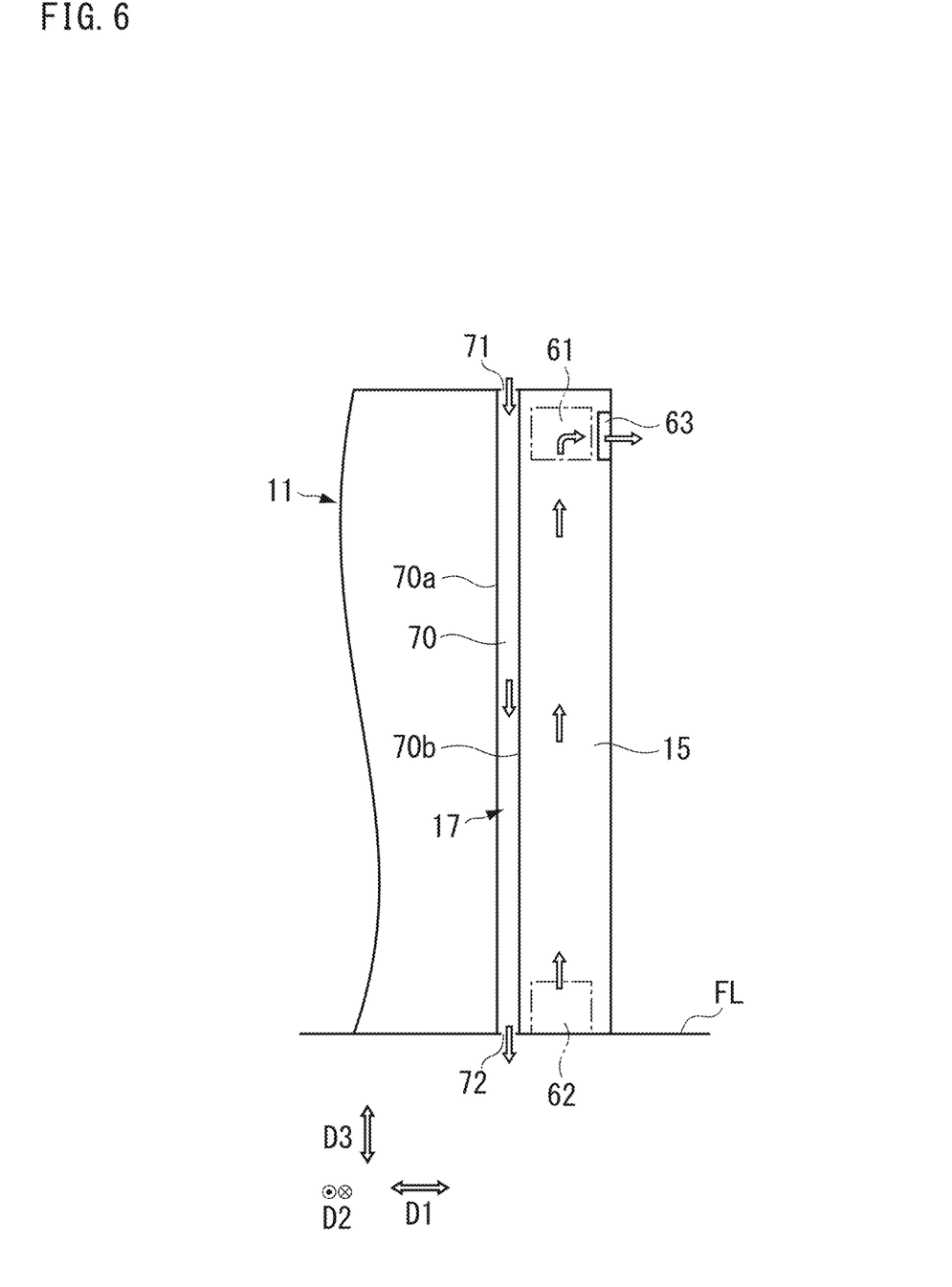
FIG. 6 is a cross-sectional view taken along the line B-B of FIG. 3.

The control panel storage 15 stores one or a plurality of control panels CR, which control the respective elements or portions of the stocker 100. FIG. 3 is a side view of the stocker 100 showing the control panel storage 15 as viewed from a side (in a first direction D1). FIG. 4 is a front elevation view of the stocker 100 showing the control panel storage 15 as viewed from the front side. FIG. 5 is a cross-sectional view taken along the line A-A of FIG. 4. FIG. 6 is a cross-sectional view taken along the line B-B of FIG. 3. As shown in FIG. 3, the control panel storages 15 are provided at two locations on the inner side of the wall 11 and are spaced in the second direction D2. As shown in FIG. 4, each control panel storage 15 is located on one end side of the storage area 12 in the first direction D1 (that is, laterally to the storage area 12).

Each second fan 63 is provided on the upper side of the control panel storage 15, and on the first direction D1 side surface. The second fan 63 is provided on a wall 15a of the control panel storage 15 that faces the outside. That is to say, the second fan 63 is located laterally on the opposite side to the storage area 12 of the control panel storage 15. The wall 15a defines the wall 11 of the stocker 100. The second fan 63 draws in the air in the control panel storage 15 and releases the air to the outside of the stocker 100. The second fan 63 is located above the height of the fans 14 mentioned above (see FIG. 2). Although a single second fan 63 is used for each control panel storage 15 in the drawings, preferred embodiments of the present invention are not limited to this configuration, and a plurality of second fans 63 may be used for each control panel storage 15.

The first thermal insulation layer 16 is provided on the wall 11 side of the control panel storage 15. That is to say, the first thermal insulation layer 16 is located between the control panel storage 15 and the wall 11 in the second direction D2. As shown in FIG. 3 to FIG. 5, the first thermal insulation layer 16 includes a duct 60 defining and functioning as a ventilation layer which allows air to flow therethrough. The duct 60 extends in the vertical direction along the control panel storage 15 and includes a first vent 61 and a second vent 62.

The first vent 61 is located at an upper portion of the duct 60. The first vent 61 is provided in a wall 60a of the duct 60 on the wall 11 side. The wall 60a defines a portion of the wall 11 of the stocker 100. The first vent 61 is faces and opens in the second direction D2. The first vent 61 communicates the outside of the wall 11 with the inside of the duct 60. The opening of the first vent 61 preferably has a rectangular or substantially rectangular shape, however, it is not limited to this configuration and may be formed in another shape such as a circular shape, an elliptical shape, an oval shape, and a polygonal shape, for example. A filter may be attached to the first vent 61 in order to prevent debris from entering the duct 60.

The second vent 62 is located at a lower portion of the duct 60. The second vent 62 is provided in a wall 60b of the duct 60 on the control panel storage 15 side. The upper end of the wall 60b is in contact with a lid 11b of the stocker 100 and is closed, and the inside of the duct 60 and the inside of the control panel storage 15 are communicated with each other by the second vent 62. In the duct 60, the clearance between the wall 60a and the wall 60b in the second direction D2 is set to a clearance that enables blockage or suppression of heat transfer from the wall 60b to the wall 60a in the second direction D2 when air flows through the duct 60. For example, the clearance between the wall 60a and the wall 60b in the second direction D2 may be set according to the flow rate of the air caused to flow through the duct 60 by the second fan 63. The opening of the second vent 62 preferably has a rectangular or substantially rectangular shape, however, it is not limited to this configuration and may be formed in another shape such as a circular shape, an elliptical shape, an oval shape, and a polygonal shape, for example. The areas of the openings of the first vent 61 and the second vent 62 may be the same or different.

As shown in FIG. 3 and FIG. 5, the air in the control panel storage 15 is released to the outside of the stocker 100 by driving the second fan 63, such that the pressure within the control panel storage 15 is reduced and the air in the duct 60 is introduced from the second vent 62 into the control panel storage 15. As the air is introduced into the control panel storage 15, the pressure in the duct 60 is reduced, and the outside air is introduced into the duct 60 from the first vent 61.

Therefore, when the second fan 63 is driven, an air flow is generated from the first vent 61 to the second fan 63. That is to say, the air outside the stocker 100 is introduced into the duct 60 from the first vent 61 and flows downward in the duct 60. This air is introduced into the control panel storage 15 from the second vent 62, flows upward through the control panel storage 15, and is released from the second fan 63 to the outside of the stocker.

This air flow causes the heat generated in the control panel CR (see FIG. 1) to be transported by the air flowing in the control panel storage 15 and is then released from the second fan 63 to the outside of the stocker 100. Thus, the heat generated in the control panel CR is released to the outside of the stocker 100 along with air. Air also flows downward in the duct 60, and this prevents or suppresses the heat of the control panel CR from being transferred from the wall 60b on the inner side of the duct 60 in the second direction D2 and reaching the wall 60a on the outer side and the wall 11. In the configuration in which the fans 14 arranged on the wall 11 draw in outside air and introduce the air into the storage area 12, the air, the temperature of which has risen as a result of the heat having been transferred from the wall 11 and so forth of the control panel storage 15 to the outside, may be drawn in by another fan 14 that is also provided on the same wall 11 in some cases. However, in the present preferred embodiment, by providing the first thermal insulation layer 16, it is possible to block or suppress transfer of the heat from the control panel storage 15 to the wall 11 and the wall 60a, and to suppress the temperature rise in the air introduced into the storage area 12 by the fans 14. Therefore, the fans 14 can be provided on the wall 11 in the vicinity of the duct 60 (that is, in the vicinity of the control panel storage 15). The second fan 63 is attached to the surface different from the surface on which the fans 14 (see FIG. 1 and FIG. 2) are installed, and is arranged above the fans 14, so that the air released from the second fan 63 is prevented from being introduced into the inside of the stocker 100 (the storage area 12) from the fans 14.

The second thermal insulation layer 17 provided on the storage area 12 side of the control panel storage 15. That is to say, the second thermal insulation layer 17 is located between the control panel storage 15 and the storage area 12 in the first direction D1. As shown in FIG. 4 and FIG. 6, the second thermal insulation layer 17 includes a duct 70 defining and functioning as a ventilation layer, which allows air to flow therethrough. The duct 70 extends in the vertical direction along the control panel storage 15 and includes an inlet 71 and an outlet 72.

The inlet 71 opens a portion of the lid 11b at the upper end of the duct 70. For example, the inlet 71 opens toward the ceiling CL, and introduces the air in the building F into the inside of the duct 70. As described above, the downward air flow from the ceiling fans CF is generated in the ceiling CL of the building F, and the air from the ceiling fans CF is taken into the duct 70 from the inlet 71. However, the position of the inlet 71 is not limited to the upper end of the duct 70. For example, the inlet 71 may be provided at an upper portion of a wall 70a on the storage area 12 side of the duct 70. In such a case, the air in the storage area 12 may be introduced into the duct 70 by a fan.

The outlet 72 is provided at the lower end of the duct 70. The outlet 72 opens downward, and can release the air in the duct 70 toward the lower side of the stocker 100. The duct 70 is provided so that the air introduced from the inlet 71 moves downward and is directly released from the lower side of the stocker 100. The outlet 72 is not limited to opening toward the lower side of the duct 70. For example, the outlet 72 may be provided at a lower portion of the wall 70a on the storage area 12 side of the duct 70, or may be provided at a lower portion of a wall 70b on the control panel storage 15 side. When the outlet 72 is provided at the lower portion of the wall 70b, the air in the duct 70 is drawn in by the second fan 63 described above.

The air outside the stocker 100 is introduced into the duct 70 from the inlet 71 and flows downward in the duct 70 to be released from the outlet 72 to the outside of the stocker 100. This air flow prevents or suppresses the heat generated in the control panel CR (see FIG. 1) from being transferred in the first direction D1 and reaching the storage area 12. In the duct 70, the clearance between the wall 70a and the wall 70b in the first direction D1 is set to a clearance that enables blockage or suppression of heat transfer from the wall 70b to the wall 70a in the first direction D1 when air flows through the duct 70. For example, the clearance between the wall 70a and the wall 70b in the first direction D1 may be set according to the flow rate of the air introduced from the ceiling fans CF through the inlet 71.

As shown in FIG. 2, the main body 10 includes a connector 11a and the lid 11b. The connector 11a extends from the upper portion of the wall 11 to the ceiling CL. The connector 11a surrounds the wall 11 of the stocker 100 as viewed from above. With this configuration, the connector 11a guides the air caused to flow downward by the ceiling fans CF of the ceiling CL, to above the stocker 100 (the upper side of the space surrounded by the wall 11). This connector 11a makes it easy to take the air caused to flow downward by the ceiling fans CF of the ceiling CL, into the inlet 71 of the duct 70.

The lid 11b closes the upper end of the internal space of the stocker 100 including the storage area 12. The lid 11b regulates the air caused to flow downward by the ceiling fans CF of the ceiling CL from entering the stocker 100. Air is supplied to the storage area 12 from the duct 13 through the blowout openings 13c, 13d. The presence of the lid 11b prevents the air from moving toward the upper side from the inside of the stocker 100.

Whether or not to install the connector 11a and the lid 11b is arbitrary, and one or both of the connector 11a and the lid 11b may be omitted. The connector 11a and the lid 11b are not limited to being provided having no clearance therebetween, and may be installed in the state of partly having a clearance therebetween. The connector 11a is not limited to extending upward from the wall 11 of the stocker 100. For example, the connector 11a may be installed so as to expand outward or to narrow inward from the wall 11.

The racks 20 are provided in the storage area 12, and are each able to have the article M placed thereon. The racks 20 are supported by a support shaft or the like not shown in the drawings and are provided in a plurality of stages in the vertical direction in the storage area 12. In the present preferred embodiment, such a plurality of racks 20 are respectively arranged on both sides along the traveling direction of the transporter 40. Each rack 20 may include a cutout not shown in the drawings. Each rack 20 may be provided with three pins not shown in the drawings, on an upper surface thereof, for example. The pins project upward from the upper surface of the rack 20, and can position the article M on the rack 20 by having them inserted into grooves provided on the bottom surface of the article M.

Each rack 20 includes a supply nozzle 21 of a purging apparatus provided thereon. The supply nozzle 21 is arranged so as to connect to a purge gas inlet (not shown in the drawings) provided on the bottom surface of the article M when the article M is placed on the rack 20. When the article M is placed on the rack 20, the purge gas inlet of the article M is connected to a purge gas source 23 from the supply nozzle 21 via a pipe 22, and a purge gas is supplied into the article M through the purge gas inlet. The supply nozzle 21 may not be provided in some or all of the racks 20. Supply of the purge gas into the article M may be performed at a location other than the rack 20. For example, the purge gas may be supplied into the article M at a load port to transport the article M into the stocker 100 (not shown in the drawings).

The transferer 30 transfers the article M to the rack 20 defining and functioning as a transfer location. The transferer 30 includes a base 31, an extender/retractor 32, and an article holder 33. The base 31 is fixed to an elevation platform 43 described later. The extender/retractor 32 is able to extend to or retract from the base 31. The article holder 33 is attached to a distal end of the extender/retractor 32 and can hold the article M. The article holder 33 is movable, for example, in extending and retracting directions of the extender/retractor 32. A configuration to place and hold the article M is applied to the article holder 33, and can pass through the cutout of the rack 20 mentioned above in the vertical direction. The transferer 30 is not limited to the configuration to place the article M. For example, a configuration to sandwich and hold a flange provided at the upper portion of the article M or a configuration to grip and hold the side surfaces of the article M may be applied to the transferer 30.

The transporter 40 includes rails R, a traveler (not shown in the drawings) that travels along the rails R, a mast 42 provided on the traveler, and an elevation platform 43 that is raised or lowered along the mast 42. The rails R are parallel to the floor and the ceiling (the lid 11b) in the stocker 100. The rails R extend along the first direction D1 (along the storage area 12) in parallel with the wall 11, on which the fans 14 are provided. Although two rails R are shown in FIG. 1, the number of the rails R is arbitrary, and a single rail R may be used. The traveler that travels on the rails R travels along the rails R due to a drive source such as an electric motor. The mast 42 extends along the vertical direction, and is moved together with the traveler due to the driving of the traveler. The elevation platform 43 is raised or lowered in the vertical direction along the mast 42 by the drive source such as an electric motor, and is held at an arbitrary height.

In the stocker 100 described above, the control panel CR (controller) stored in the control panel storage 15 controls the operation of transporting the article M into or from the stocker 100 as well as the operation of transferring the article M to the rack 20. When transporting the article M into the stocker 100, after the article M placed in the load port (not shown in the drawings) is received by the transferer 30, the transferer 30 is moved by the transporter 40 to the transport destination rack 20. Then, the extender/retractor 32 of the transferer 30 is extended from the base 31 to move the article holder 33 to above the rack 20. By lowering the elevation platform 43 in this state, the article M is placed on the rack 20. Through this operation, the article M is placed on the rack 20 at the transport destination.

When transporting out the article M, the transporter 40 moves the transferer 30 to the rack 20, on which the article M to be transported out is placed. Then, the extender/retractor 32 of the transferer 30 is extended to move the article holder 33 to below the rack 20. By raising the elevation platform 43 in this state, the article M is transferred to the article holder 33 from the rack 20. Then, the extender/retractor 32 is retracted and the article holder 33 having the article M placed therein is held on the base 31. Thereafter, the transporter 40 moves the transferer 30 to the load port, and the transferer 30 transfers the article M onto the load port. This operation completes the transportation of the article M.

When the controller performs the above operations of the stocker 100, the control panel CR generates heat. In the stocker 100 of the present preferred embodiment, the first thermal insulation layer 16 and the second thermal insulation layer 17 release the heat generated in the control panel CR to the outside of the stocker 100, and prevents the heat of the control panel CR from being transferred to the storage area 12 while also preventing the temperature of the air taken in by the fans 14 from rising.

Specifically, in the first thermal insulation layer 16, air is introduced into the duct 60 from the outside of the stocker 100 through the first vent 61 due to the drive of the second fan 63, and this air flows through the inside of the control panel storage 15 via the second vent 62 to transport the heat of the control panel CR, and is then released to the outside of the stocker 100 from the second fan 63, thus preventing or reducing the temperature rise in the air taken in by the fans 14. In the second thermal insulation layer 17, the air flowing downward from the ceiling fans CF in the ceiling CL flows downward through the duct 70 via the inlet 71, and is then released to below the stocker 100 through the outlet 72, thus preventing the heat of the control panel CR from being transferred to the storage area 12. As a result, in the storage area 12 of the stocker 100, the temperature rise due to the heat of the control panel CR is prevented or reduced. Neither the first thermal insulation layer 16 nor the second thermal insulation layer 17 allows air to flow within the stocker 100, and the air taken in is released to the outside. Releasing of the air prevents the temperature rise in the stocker 100 (the storage area 12).

As described above, since the stocker 100 according to the present preferred embodiment includes the first thermal insulation layer 16 on the wall 11 side of the control panel storage 15 and the second thermal insulation layer 17 on the storage area 12 side of the control panel storage 15, the heat from the control panel CR is blocked or suppressed from being transferred to the storage area 12 on the wall 11 side and on the storage area 12 side of the control panel storage 15, and the temperature rise in the air taken in by the fans 14 is blocked or suppressed. This configuration enables reduction in the influence of heat on the article M placed in the storage area 12.

Figure 7:
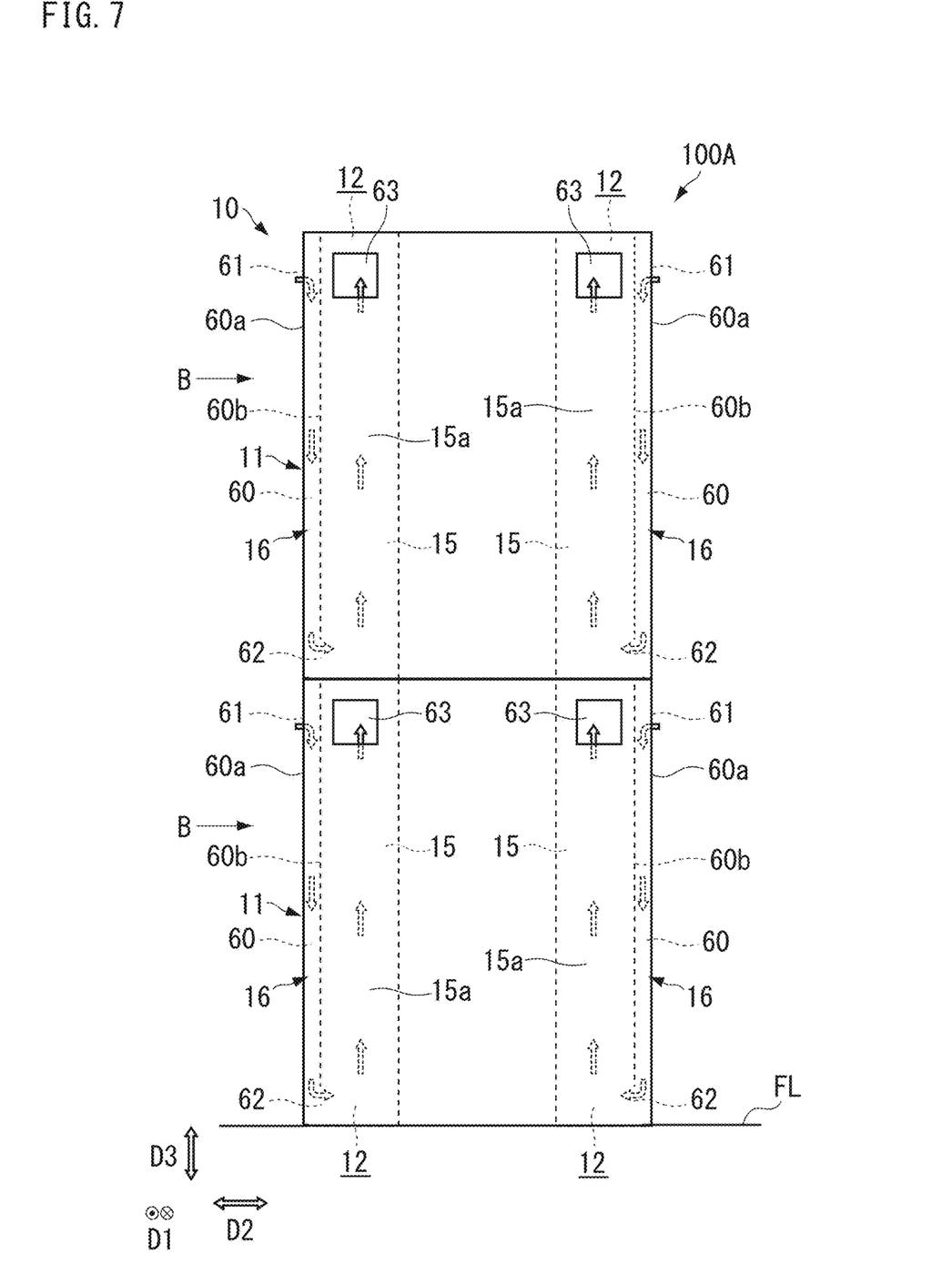
FIG. 7 is a diagram showing another example of a stocker according to a preferred embodiment of the present invention.

FIG. 7 is a diagram showing another example of the stocker. In a stocker 100A shown in FIG. 7, the control panel storages 15 are provided in two layers one above the other. The same configurations as those of the stocker 100 mentioned above shown in FIG. 1 are applied to the stocker 100A shown in FIG. 7 except that the control panel storages 15 are provided in two layers one above the other. The first thermal insulation layer 16 is provided for each layer, and the second fan 63 is provided in the control panel storage 15 for each layer. As for the second thermal insulation layer 17, an upper duct 70 may be connected to a lower duct 70, for example.

According to the stocker 100A, heat from the control panel CR in the control panel storage 15 provided in each layer can be effectively blocked or suppressed from being transferred to the storage area 12. While FIG. 7 shows an example in which the control panel storages 15 are provided in two layers, the same applies to the case where the control panel storages 15 are provided in three or more layers.

The preferred embodiments of the present invention have been described above. However, the present invention is not limited to the above description, and various modifications may be made without departing from the gist of the present invention. For example, in the above preferred embodiments, the configuration, in which the second thermal insulation layer 17 includes the duct 70 defining and functioning as a ventilation layer, which allows air to flow therethrough, has been described as an example, but preferred embodiments of the present invention are not limited to this configuration. For example, instead of the duct 70, a thermal insulation material may be used for the second thermal insulation layer 17. As the thermal insulation material, a resin material such as polystyrene foam, a wood material, or a paper material may be used, for example. Instead of the duct 70, the duct 60, which is applied to the first thermal insulation layer 16, may be used for the second thermal insulation layer 17. In such a case, a configuration in which air is taken in from the outside or the inside of the stocker 100 and is released to the outside via the control panel storage 15 by operating the second fan 63, may be applied to the second thermal insulation layer 17.

Although the duct 60 is used as the first thermal insulation layer 16 in the preferred embodiments described above, instead of this configuration, a thermal insulation material such as polystyrene foam may be used as with the second thermal insulation layer 17. In such a case, for example, there may be applied a configuration in which a vent is provided in the lower portion of the control panel storage 15, and when operating the second fan 63, air is introduced into the control panel storage 15 from the outside of the stocker 100 via the vent to flow upward in the control panel storage 15, and is released to the outside of the stocker from the second fan 63. Instead of the duct 60, the duct 70, which is applied to the second thermal insulation layer 17, may be used for the first thermal insulation layer 16. In such a case, to the first thermal insulation layer 16, there may be applied a configuration in which the air flowing downward from the ceiling fans CF of the ceiling CL is taken in from the inlet 71, and is released to below the stocker 100 from the outlet 72.

In the above description, the configuration in which the second fan 63 is above the fans 14 has been described as an example, however, preferred embodiments of the present invention are not limited to this configuration. For example, the second fan 63 may be provided at the same height positions as those of the fans 14. The second fan 63 may be below the fans 14. When the second fan 63 is provided at the lower portion of the control panel storage 15, the second vent 62 is provided at the upper portion of the duct 60, and the first vent 61 is provided at the lower portion of the duct 60. With such an arrangement, when the second fan 63 is driven, the air introduced from the first vent 61 flows upward through the duct 60 and the air introduced from the second vent 62 into the control panel storage 15 flows downward in the control panel storage 15, to be released from the second fan 63 to the outside of the stocker 100.

Furthermore, the contents of Japanese Patent Application No. 2017-020225 and all documents cited in the detailed description of the present invention are incorporated herein by reference to the extent permitted by law.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:
1. A stocker comprising:
a wall that separates an inside and an outside of the stocker;
a storage area provided on an inner side of the wall to store articles;
a fan provided on the wall to draw in outside air and introduce the outside air into the inside of the stocker;
a control panel storage provided on the inner side of the wall and laterally to the storage area to store a control panel;
a first thermal insulation layer on a wall side of the control panel storage;
a second thermal insulation layer on a storage area side of the control panel storage; and
a transporter to move an article included in the articles to a transport destination when transporting the article into the stocker; wherein
the wall has a rectangular or substantially rectangular shape as viewed from above;
the fan is located on the wall along a first direction;
the control panel storage is located on one end side in the first direction with respect to the storage area;
the first thermal insulation layer is located between the control panel storage and the wall on which the fan is located, in a second direction orthogonal to the first direction;
the second thermal insulation layer is located between the control panel storage and the storage area;
the control panel controls an operation of the transporter;
in a plan view of the stocker, the control panel storage does not overlap the storage area; and
in the plan view of the stocker, the second thermal insulation layer is located between the control panel storage and the storage area.
2. The stocker according to claim 1, wherein the first thermal insulation layer is a ventilation layer to allow air to flow therethrough.
3. The stocker according to claim 2, wherein
the ventilation layer includes a duct extending in a vertical direction; and
the duct includes:
a first vent provided in one of an upper portion and a lower portion of the stocker to communicate the outside of the wall with the inside of the duct;
a second vent provided in the other of the upper portion and the lower portion of the stocker to communicate the inside of the duct with the inside of the control panel storage; and
a second fan provided laterally on an opposite side of the storage area of the control panel storage to draw in the air in the control panel storage and blow the air out to the outside the stocker.
4. The stocker according to claim 3, wherein the second fan is above the fan.
5. The stocker according to claim 3, wherein
the control panel storage is provided in multiple layers that are vertically arranged; and
the second fan is provided for each of the multiple layers.
6. The stocker according to claim 1, wherein the second thermal insulation layer is a ventilation layer that allows air to flow therethrough.

* * * * *